United States Patent
Musk

(10) Patent No.: US 9,064,861 B2
(45) Date of Patent: Jun. 23, 2015

(54) ASSEMBLY AND A CHIP PACKAGE

(71) Applicant: Robert William Musk, Kingsbridge (GB)

(72) Inventor: Robert William Musk, Kingsbridge (GB)

(73) Assignee: EFFECT PHOTONICS B.V., Eindhoven (NL)

( * ) Notice: Subject to any disclaimer, the term of this patent is extended or adjusted under 35 U.S.C. 154(b) by 0 days.

(21) Appl. No.: 14/385,861

(22) PCT Filed: Mar. 18, 2013

(86) PCT No.: PCT/NL2013/050200
§ 371 (c)(1),
(2) Date: Sep. 17, 2014

(87) PCT Pub. No.: WO2013/141701
PCT Pub. Date: Sep. 26, 2013

(65) Prior Publication Data
US 2015/0076661 A1 Mar. 19, 2015

(30) Foreign Application Priority Data
Mar. 18, 2012 (GB) .................................. 1204713.0

(51) Int. Cl.
*H01L 23/48* (2006.01)
*H01L 23/498* (2006.01)
(Continued)

(52) U.S. Cl.
CPC ............ *H01L 23/4985* (2013.01); *H01L 24/14* (2013.01); *H01L 23/3142* (2013.01);
(Continued)

(58) Field of Classification Search
CPC . H01L 23/4985; H01L 23/13; H01L 23/5387; H01L 23/49816; H01L 24/82; H05K 1/189

USPC ..................................................... 257/738, 780
See application file for complete search history.

(56) References Cited

U.S. PATENT DOCUMENTS 6,313,402 B1    11/2001   Schreiber et al.
6,359,335 B1 *   3/2002   Distefano et al. ............. 257/707
(Continued)

FOREIGN PATENT DOCUMENTS

| EP | 0 080 041 A2 | 6/1983 |
|---|---|---|
| FR | 2 962 593 A1 | 1/2012 |
| GB | 2500380 A | 9/2013 |
| WO | 2004/077525 A2 | 9/2004 |

OTHER PUBLICATIONS

International Search Report, dated Jul. 18, 2013, from corresponding PCT application.

*Primary Examiner* — Trung Q Dang
(74) *Attorney, Agent, or Firm* — Young & Thompson

(57) ABSTRACT

An assembly (60) includes a substrate (1) that is provided with at least one electrical contact (3a), a flexible printed circuit membrane (51) including an electrically insulating film (6) and an electrically conducting layer (7) that is at least partially covering the insulating film (6). The conducting layer (7) is at least locally accessible from outside of the membrane (51). A connection element (10) is provided for electrically connecting the at least one electrical contact (3a) and the conducting layer (7) at a position where the conducting layer (7) is accessible, to form an electrical connection between the substrate (1) and the membrane (51). A chip package (70) includes a housing (15) having at least one electrically conducting terminal, and an assembly (60) as mentioned. The flexible printed circuit membrane (51) is arranged for electrically connecting the substrate and the at least one terminal of the housing (15).

15 Claims, 4 Drawing Sheets

(51) Int. Cl.
  *H01L 23/00* (2006.01)
  *H01L 23/31* (2006.01)
  *G02B 6/12* (2006.01)

(52) U.S. Cl.
  CPC ........ *G02B 6/12* (2013.01); *H01L 2224/13144* (2013.01); *H01L 2924/01029* (2013.01); *H01L 2924/12042* (2013.01); *H01L 2924/12041* (2013.01); *H01L 2924/10335* (2013.01); *H01L 2924/14* (2013.01)

(56) References Cited

U.S. PATENT DOCUMENTS

| | | |
|---|---|---|
| 6,362,429 B1 | 3/2002 | Moden |
| 2004/0061220 A1 | 4/2004 | Miyazaki et al. |
| 2008/0096366 A1* | 4/2008 | Aoki et al. .............. 438/455 |
| 2009/0107703 A1* | 4/2009 | Abe et al. ............... 174/254 |
| 2010/0230148 A1* | 9/2010 | Kariya et al. ........... 174/258 |
| 2013/0074331 A1 | 3/2013 | Brun |

\* cited by examiner

ASSEMBLY AND A CHIP PACKAGE

FIELD OF THE INVENTION

The present invention relates to an assembly comprising a substrate that is provided with at least one electrical contact and a flexible printed circuit membrane (PCM) that is electrically connected to the substrate.

The present invention further relates to a chip package comprising a housing having at least one electrically conducting terminal that is electrically connected to an assembly as mentioned.

BACKGROUND OF THE INVENTION

Because of the increasing complexity of integrated circuits (ICs) in general and photonic integrated circuits (PICs) in particular, the physical size and number of electrical connections required increases as well as the heat generated in devices of ICs. Excess heat needs to be effectively removed in order not to compromise performance of individual devices and consequently of the ICs to which they belong.

Conventional methods of providing electrical connections to a substrate that for example comprises a PIC, either using wire bonding techniques or flip chip bonding both present problems.

In the case of wire bonding, the length of wires as well as their density can seriously affect the performance and manufacturability of a device, either active or passive. Unlike in the case of standard electronic integrated circuits (EICs), in PICs the electrical connections can rarely be routed to the edges of the device to provide the necessary external onward connections to, e.g. associated terminals of a package. Moreover, on account of the design rules associated concerning wire length, which take into account the need for mechanical support during shock and vibration etc., it becomes difficult with large PICs to place wire bonds across the entire surface of the PIC. In addition high speed performance may also be compromised by the use of long wire bonds.

A technique often used for high electrical contact density EICs is known as flip chip bonding. In this method, each of the electrical contacts on the device is usually either made of solder or is solder coated or they are 'stud bumped' using a special machine very similar to a gold wire bonder that attaches a gold ball to the device contact. Flip chip bonding can be readily used also for sensors and other devices provided they are physically strong enough. This is usually the case if the devices are, for example, made of silicon (Si). However, the material for PICs usually comprises Indium Phosphide (InP), a material which lacks the mechanical strength of silicon. In the case of flip chip bonding, stresses created by the flip chip process and interconnect material and process can impair performance and reduce the thermal performance. Stress-induced damage can range from impairing the performance of the local waveguide of a PIC to mechanical breakage of the PIC.

When packaging devices and/or ICs, wire bonds are typically arranged between the device and an interconnect substrate of a chip package and subsequently between the interconnect substrate and at least one electrically conducting terminal of the chip package in order to maintain high-speed performance or meet design rules for wire bond lengths.

In order to enhance removal of excess heat from for example a packaged PIC, a thermoelectric cooler (TEC) can be arranged between the PIC and a housing of the chip package. Bond wires that are arranged between the interconnect substrate and the at least one electrically conducting terminal of the chip package provide a short thermal bridge and can reduce the efficiency of the TEC due to the thermal path conducting heat from the temperature controlled surface of the TEC to the ambient environment. If flip chip bonding were to be used, it could become difficult to extract the heat generated by the PIC through a relatively small area presented from the PIC through the bumps, which provide a poor thermal path to extract heat from the PIC. The problem of heat conduction is further aggravated by the generally small cross section of the bumps.

SUMMARY OF THE INVENTION

It is an object of the present invention to provide an assembly that is capable of providing a very high-density of low-stress electrical connections with high electrical performance and a more efficient heat management than is possible either using wire bonding or flip chip mounting. Furthermore, it is an object of the present invention to provide a chip package comprising an assembly as mentioned.

The objects of the present invention are achieved by means of an assembly comprising a substrate that is provided with at least one electrical contact, a flexible printed circuit membrane comprising an electrically insulating film and an electrically conducting layer that is at least partially covering the insulating film, wherein the conducting layer is at least locally accessible from outside of the membrane, and a connection means that is arranged for electrically connecting the at least one electrical contact and the conducting layer at a position where the conducting layer is accessible, to form an electrical connection between the substrate and the membrane. The flexible printed circuit membrane (PCM) of the assembly according to the present invention in fact provides a planar routed electrical interconnection system having at least one electrically conducting layer. The flexible PCM provides point-to-point electrical connections for so-called wafer level packaging, i.e. between yet unpackaged first and second substrates, which comprise for example a PIC and an EIC respectively, in the same way that a conventional printed circuit board (PCB) provides such electrical connections between for example a first and a second chip package. Therefore, by using an assembly according to the present invention, excessive wire bond lengths and so-called 'birds nest' problems with crossing wire bonds can be avoided. A flexible PCM is somewhat akin to a conventional flexible PCB in that it has one or more conducting tracks carried on a flexible insulating substrate. However, compared to a conventional PCB, a PCM is an order of magnitude thinner to provide a higher degree of flexibility of the PCM, thereby to avoid placing undue stresses and/or strains onto the electrical contact connected to it. As a result, the stresses and/or strains that may be applied to a substrate via the electrical contact that is connected with the flexible PCM can be reduced to a level that damage to the substrate can be prevented. The electrical contact arranged on the substrate preferably takes the shape of a contact pad.

The conducting layer of the flexible PCM may be attached to a surface of the insulating film adhesively or may be formed on a surface of the insulating film by a deposition process. Suitable deposition processes are, for example, evaporation, sputtering or plating.

The conducting layer of the flexible PCM may be shaped into one or more conducting tracks, depending on the desired electrical circuit configuration. Photolithographic or laser cutting techniques can provide minimum widths of tracks formed in the conducting layer, and spacings between tracks, of the order of 20 µm.

The insulating films are typically, but not limited to polyimide or Kapton® presented either in film or liquid form and the metal conducting layers are typically, but not limited to, gold or copper, either deposited by sputtering or evaporation or by plating. The insulating film may be shaped using a laser to cut the film material as required.

The coefficient for thermal expansion for an insulating polyimide layer can range from around 50 ppm/° C. to as low as 3 ppm/° C. depending on the material selected. Kapton® has a value of 20 ppm/° C. PICs are usually fabricated with InP with a thermal expansion coefficient around 4.75 ppm/° C. In comparison, Si has a thermal expansion coefficient around 2.6 ppm/° C.

The assembly according to the present invention may provide for more efficient heat management than either wire-bonded devices or flip chip mounted devices. For an active device such as a PIC, heat generated during functional operation is typically generated within the active or top surface of the device. The heat generated is then extracted through the bulk of the device and a heat sink attached to the back of the device, for example by using epoxy resins or eutectic solders to provide a good thermal contact (and in the case of solder, good electrical contact where required). The thermal impedance of the bulk material of an InP PIC is acceptable for heat extraction. However, when the PIC is attached using flip chip technology the heat can only be extracted by the localised contact bumps which can induce further localised stresses on the structure and also result in insufficient heat extraction. In this situation it may be possible or even necessary to introduce additional 'non-functional' flip chip bumps to assist the heat extraction at the expense of losing area on the PIC.

The assembly according to the present invention also allows devices to be mounted on a TEC without sacrificing short and efficient high-speed electrical connections to the device. Furthermore, the assembly according to the present invention allows direct bonding of a device such as an InP-based PIC to an associated heat sink because it allows efficient and low-stress connections to be formed to the PIC while enabling the whole of the backside of the InP-based PIC to be thermally connected to the heat sink. By using an assembly according to the present invention, none of the stresses/strains induced to sensitive PIC features during the flip chip process due to localised points of contact/pressure points are induced when forming electrical connections to the PIC.

Thermal performance is important to the overall performance of an opto-electronic device such as a PIC or an EIC. This can be seen when related to extracting the heat from the device via the heat sink. In such cases it would be normal to use material having a high thermal conductivity to extract the heat from the device. However, it is also important that these heat extracting materials are also expansion matched to the material of the substrate comprising the device in order not to induce stress or strain when exposed to differential temperatures. The assembly according to the present invention obviates the need for any electrical connections or routing through the attached heat sink material. In contrast, the conventional wire bonding and flip chip techniques routinely require such additional electrical interconnection on the heat sink material. Thus the use of high thermal conductivity, low thermal expansion coefficient metals such as copper, tungsten or molybdenum are possible because they do not require the addition of electrical interconnect on the substrate. In addition, other high thermal conductivity, low thermal expansion coefficient materials, but not limited to, refractory materials such as aluminium nitride or silicon carbide or boron nitride are also useable as heat sink materials and also do not require the addition of electrical interconnect to be embodied into them.

The assembly according to the present invention does not require the use of additional thermal contacts and thus enables the maximum use of the surface area of the substrate for functional features. Indeed, it would be possible to attach an additional heat sink on top of the flexible PCM above a PIC or EIC comprised by the substrate to further enhance the thermal dissipation from such device. This would not be possible with a conventional wire bonded device.

In an embodiment of the assembly according to the present invention, the insulating film is provided with at least one aperture for locally exposing the conducting layer, wherein the aperture is aligned with the electrical contact, and wherein the connection means is arranged at a position of the at least one aperture of the insulating film. A lithographic technique may be used in which the insulating film is coated with a thin film of photoresist which is then exposed to an image of the required at least one aperture. The lithographic technique may be used to discard areas of the insulating film or cause selected areas of the insulating film to be made thinner. After processing, the unexposed regions of the photoresist are removed and then exposed to a suitable etchant to locally remove material from the insulating film to form the at least one aperture. The processed insulating film is then coated with a thin layer of metal, usually gold or copper, either by evaporation, sputtering or plating, to form the conducting layer of the flexible PCM.

The conducting layer, which for example is a metal layer, can be provided with electrical tracks that are created by coating the entire metal layer with photoresist and exposing an image of the required electrical tracks onto the photoresist and subsequently etching away all the metal that does not form part of the electrical tracks. Alternatively, the electrical tracks may be created by evaporating or sputtering the metal layer through a suitable mask which is in close contact with the insulating film of the flexible PCM.

In an embodiment of the assembly according to the present invention, the conducting layer as exposed in the at least one aperture of the insulating film has a hole aligned with the aperture, and wherein the connection means is arranged to locally deform the conducting layer at the position of the hole. Minimum aperture sizes in the insulating film may be of the order of 20 μm. They may also be larger if required to provide a satisfactory dimension for the exposed conducting layer and/or the aperture therein. Minimum dimensions of the exposed conducting layer forming a contact area are generally around 60 μm. The diameter of the hole in the conducting layer should generally not be less than 30 μm. The foregoing dimensions enable systems with very high-density, very high-speed interconnects. The arrangement may advantageously be extended to two or more conducting layers as will be described further below.

In an embodiment of the assembly according to the present invention, the connection means comprises a ball-shaped conducting material. Depending on the application, the conducting material may comprise a metal or a conductive epoxy. A suitable metal to be used is gold.

The ball-shaped conducting material is connected with the flexible PCM preferably using a ball bond, that is a bond in which a conducting ball extends through a hole in the conducting layer that electrically connects both the at least one conducting layer of the flexible PCM and an associated electrical contact arranged on a substrate that for example comprises a PIC. In addition, ball bonding provides mechanical support for the structure.

The use of gold conducting layers and gold bonding balls is common practice for interconnecting microelectronic circuits, such as thick film, thin film, EICs, transistors etc. Copper is also used for wire bonding due to lower material costs, but is a more difficult process to control due to oxide formation on the copper which can prevent reliable metal-to-metal bonding. Gold wire bonding does not suffer from oxide formation and results in a more easily controlled bonding process. However, in the case of the flexible PCM according to the present invention, there may be a requirement to attach one end of the PCM to another structure such as an electrical connector by soldering. Solders commonly used contain large amounts of tin. A typical lead-free solder in common use comprises 96.5% tin, 3.0% silver, 0.5% copper. When molten, the tin will quickly dissolve any gold film that it is in contact with, whereas a thin copper track will not be dissolved. It is possible to fabricate a combination of metals within the flexible PCM using copper for those areas required for soldering and gold for those areas for wire or bump bonding.

In an embodiment of the assembly according to the present invention, the substrate comprises a semiconductor substrate that may comprise an opto-electronic device such as a photonic integrated circuit (PIC) having for example an optical waveguide, a laser, a trans impedance amplifier, at least one electrical contact etc. The substrate may also comprise a ceramic material which is commonly used for passive circuits such as matching networks comprising for example at least one electrical contact, a transmission line, a capacitor, an inductor and/or a resistor. In the case of a PIC, the semiconductor substrate generally comprises Indium Phosphide (InP), which can be used both for active devices such as lasers and light emitting diodes (LEDs) and passive devices such optical waveguides. The conducting layer of the flexible PCM of the assembly is electrically connected to at least one electrical contact on the substrate via connection means such as gold balls.

In an embodiment of the assembly according to the present invention, the flexible printed circuit membrane comprises a mechanical decoupling means that is arranged for mechanically decoupling the electrical connection from externally applied stress and/or strain. In this way, possible damage to device structures where externally applied stress and/or strain may otherwise be placed on the electrical connection between the substrate and the flexible PCM formed according to the present invention, may be prevented. The mechanical decoupling means may be formed as at least one of a bend and a fold in the flexible PCM. It will be apparent to the person skilled in the art that any mechanically equivalent implementation of the decoupling means which is capable of absorbing external stresses and/or strains can be used. The mechanical decoupling means may be used to advantage if for example two or more independent devices, whether two or more PICs or at least one PIC and another device or devices such as EICs, are connected by a flexible PCM of the assembly according to the present invention. Such a requirement may arise, for example, within an optical transceivers, where a transmitter and a receiver may require some electrical connections between them and may move relative to each other for example on account of heat-related expansion and/or contraction.

In an embodiment of the assembly according to the present invention, the PCM comprises a conducting layer having a thickness in a range from 0.5 µm to 6 µm and an insulating film having a thickness in a range from 5 µm to 9 µm. In a preferred embodiment of the assembly, the conducting layer is preferably of the order of 3 µm thick and the insulating film is of the order of 6 µm thick. It is apparent to the person skilled in the art that the actual thicknesses used will be chosen according to, and will depend upon the flexibility and current carrying requirements for the application envisaged.

In an embodiment of the assembly according to the present invention, the flexible printed circuit membrane comprises two insulating films, and a conducting layer that is sandwiched between the two insulating films. Outside the at least one position of a connection means forming an electrical connection between the conducting layer of the flexible PCM and for example an electrical contact of a device that is arranged on the flexible PCM, in this way it is possible to completely shield the conducting layer from the substrate and the outside environment. An electrical connection between the conducting layer of the flexible PCM and an electrical contact of a device that is arranged on the flexible PCM can be realized by providing an aperture in at least one of the two insulating layers for locally exposing the conducting layer of the flexible PCM, wherein a connection means such as a bond wire or a metal bump can be arranged between the conducting layer in the aperture and the electrical contact of the device.

In an embodiment of the assembly according to the present invention, the flexible printed circuit membrane comprises a stack of at least two insulating films and at least two conducting layers that are alternately arranged, wherein the at least two conducting layers are electrically interconnected through at least one electrical bridge. The abovementioned stack can be expanded by adding an additional insulating film on one of the two conductive layers. This can for example be done by applying an insulating material in liquid form. After solidification of the insulating material an additional insulating film is formed on top of which a further conducting layer may be formed if desired. In such a multilayer structure the conducting layer can be provided by tracks according to a desired layout as has been described above.

The at least two conducting layers that are separated by at least one insulating film can be interconnected across this intervening insulating film by providing at least one via in the insulating film. By filling the at least one via with a conducting material at least one electrical bridge connecting the two conducting layers can be provided.

Alternatively, the at least two conducting layers to be electrically connected may extend to a position that is located beyond the edge of any intervening insulating films. The at least two conduction layers may be connected directly at this position and/or by using contact bumps. The ability to form direct electrical connections and the possibility of including multiple conducting layers to form several connecting layers and/or one or more ground planes may reduce the degradation of high-speed performance of the interconnected devices. Furthermore, the interconnection of the at least two conducting layers of the flexible PCM can be required depending on the maximum allowable current density that a single conducting layer of the flexible PCM can carry.

It is noted that depending on the application, care should be taken to ensure that the sandwich structure having at least two insulating films and at least two conducting layers remains sufficiently flexible as a whole.

In an embodiment of the assembly according to the present invention, the conducting layer is a metal layer that comprises a thin film of gold and/or copper. In the case that the conducting layer comprises both thin films of gold and copper, these films of the different materials may be arranged as adjoining sections in one conducting layer. It might also be advantageous that different conducting layers of the flexible PCM are formed by either a single thin gold film or a single thin copper film. Each of these thin metal films may at least partially cover at least one insulating film and each of these thin metal films may comprise tracks that are arranged in a desired pattern.

In an embodiment of the assembly according to the present invention, the assembly further comprises at least one further substrate that is provided with at least one electrical contact, wherein the flexible printed circuit membrane is arranged for electrically connecting the substrate and the at least one further substrate. At least one of the substrate and the at least one further substrate comprises an opto-electronic device and/or a passive integrated circuit, wherein the opto-electronic device is one of a photonic integrated circuit (PIC) and an electronic integrated circuit (EIC). According to this embodiment of the present invention, the flexible PCM may be used to provide an electrical connection between for example two or more PICs and/or EICs and/or passive integrated circuits comprising for example transmission lines, coplanar waveguides, capacitors, inductors and thin film resistors. Moreover, additional components such as for example transistors or EICs that are attached and wire bonded in a conventional manner, passive components such as, but not limited to, surface mount type capacitors or resistors may also be attached and connected to, and carried by the flexible PCM in a conventional manner. An exemplary manner of providing an electrical connection between at least one conducting layer of the flexible PCM and at least one electrical contact of the at least one additional component that is arranged on the flexible PCM and therefore is said to be carried by the flexible PCM, has been described above.

In an embodiment of the assembly according to the present invention, the assembly further comprises a printed circuit board (PCB) that is electrically connected to the flexible printed circuit membrane. The substrate of the assembly can thus be electrically connected with a PCB via the flexible PCM. In this way no chip package is required. However, care should be taken to protect the flexible PCM and the substrate and at least part of the PCB from the outside environment by applying an encapsulating material because the flexible PCM is very fragile as is apparent from the abovementioned thicknesses of the single insulating films and conducting layers that constitute the flexible PCM. In order to facilitate the encapsulation process of this embodiment of the assembly according to the present invention, it is advantageous to provide the flexible PCM with at least one open port or hole, for example a full open aperture, for receiving the encapsulating material that is arranged for infilling an interface between the substrate and the PCB or any other interconnect board. In addition, the encapsulating material can be applied to provide environmental protection for the assembly by encapsulating or sealing the entire assembly.

According to another aspect of the present invention, a chip package is provided comprising a housing having at least one electrically conducting terminal and an assembly as mentioned, wherein the flexible printed circuit membrane is arranged for electrically connecting the substrate of the assembly and the at least one terminal of the housing. Because of the flexibility of the PCM, the stresses and/or strains that may be applied to the substrate via the electrical contact, can be reduced to a level that damage to the substrate can be prevented.

In an embodiment of the chip package according to the present invention, the flexible printed circuit membrane is arranged for electrically connecting the at least one terminal of the housing and at least one of the substrate and the further substrate of the assembly. It is therefore possible to provide any electrical connection desired and/or required.

In an embodiment of the chip package according to the present invention, the flexible printed circuit membrane is provided with at least one open port or hole for receiving an encapsulating material that is arranged to seal the chip package from the outside environment. As described above with respect to the assembly according to the present invention, it is apparent that it is also advantageous in the case of the chip package to provide the flexible PCM with at least one open port or hole, for example a full open aperture, for receiving the encapsulating material that is arranged for infilling an interface between the substrate and the housing of the chip package. In addition, the encapsulating material can be applied to provide environmental protection for the chip package by encapsulating or sealing the entire chip package after it has been mounted on for example a PCB or any other interconnect board.

The above-described and other aspects of the present invention will be apparent from and elucidated with reference to the following detailed description of a number of illustrative embodiments of the assembly and the chip package. The person skilled in the art will realize that alternatives and equivalent embodiments of the invention can be conceived and reduced to practice without departing from the scope of the present invention.

BRIEF DESCRIPTION OF THE DRAWINGS

The present invention will now be explained in greater detail with reference to the figures, which are not necessarily drawn to scale, and in which equal or similar parts are indicated by the same reference signs, and in which:

FIG. 3C furthermore shows how the conducting layer of the PCM is deflected in the vicinity of the electrical connection to the electrical contact on the substrate;

The figures are not necessarily drawn to scale.

DETAILED DESCRIPTION OF THE EMBODIMENTS

Figure 1:
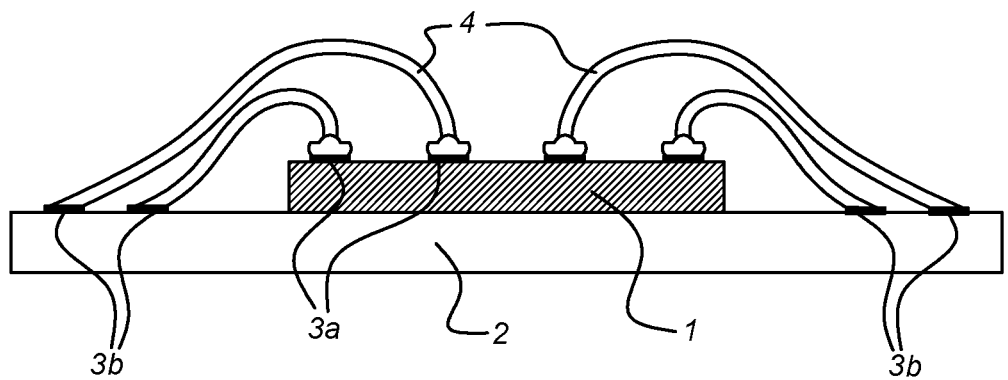
FIG. 1 illustrates wire bonding interconnects that are commonly used in packaging of for example electronic integrated circuits and photonic integrated circuits.
Figure 2:
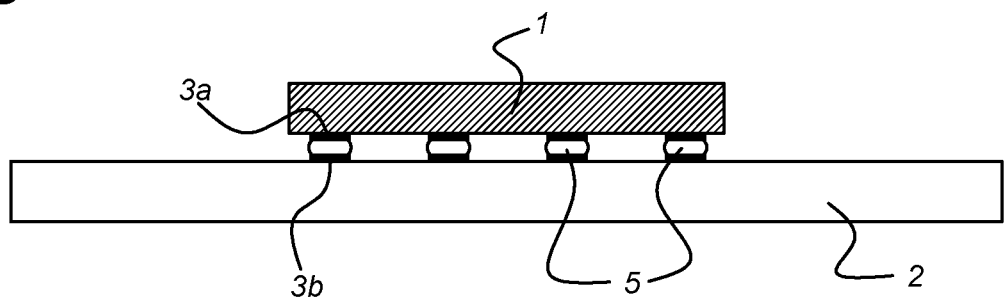
FIG. 2 illustrates flip chip bonding interconnects that are commonly used in packaging of for example electronic integrated circuits and photonic integrated circuits.

FIGS. 1 and 2 show examples of electrical connections between a carrier or supporting substrate 2 and a substrate 1 comprising for example a photonic integrated circuit (PIC). The electrical connections have been formed by wire bonding and flip chip bonding, respectively, which are conventional methods well known to a person skilled in the art.

FIG. 1 shows a sectional view of a substrate 1, which for example comprises a PIC or an electronic integrated circuit (EIC), and is mounted on a supporting substrate or carrier 2 that will normally be provided with electrically connecting tracks 3b for onward connection. As schematically indicated in FIG. 1, when electrical connections are provided by bond wires 4 that are arranged between electrical contacts 3a and electrical connecting tracks 3b which are provided on the substrate 1 and the supporting substrate 2 respectively, it may be necessary to attach bond wires 4 to electrical contacts 3a located in a central region of the substrate 1 because required electrical connections could not be routed to the edge of for example the PIC that is comprised by the substrate 1.

FIG. 2 shows electrical connections between the substrate 1 and the carrier or supporting substrate 2 that are formed using the conventional flip chip bonding technique which is widely used when packaging ICs, in particular ICs with a high electrical contact density. In the case of providing electrical connections to a PIC, each of the electrical connections 5 on the PIC comprised by substrate 1 are usually either made from solder or are solder coated, or they are provided by so-called 'stud bumping' of for example gold balls 5 using a special machine that is very similar to a gold wire bonder that attaches the gold ball 5 to the electrical contact 3a of for example a PIC comprised by the substrate 1. To provide the required electrical connections, the substrate 1 is flipped over so that the so-called stud bumps 5 are located above the corresponding electrical connection tracks 3b on the supporting substrate 2, and bonding between the stud bumps 5 and the electrical connection tracks 3b is subsequently achieved by techniques including for example soldering and thermo-compression bonding. The choice for a particular bonding technique particularly depends on the materials used for the substrate 1 and for the supporting substrate 2. Using flip-chip bonding for a PIC, provides an easy and stable manner of making electrical connections to electrical contacts of a device even if the electrical contacts are located in a central area of the PIC. However, the stresses which may be applied to the PIC during the flip chip bonding process may damage the PIC or at least impair its overall performance which includes optical, electrical and thermal performance.

Figure 3A:
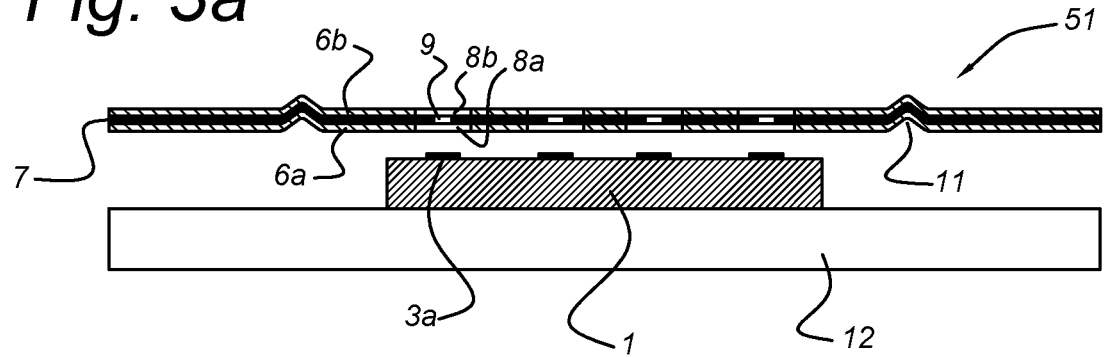
FIG. 3A shows a sectional view of an exemplary embodiment of an assembly according to the present invention with the flexible PCM as described placed above electrical contacts on a substrate to be electrically connected.
Figure 3B:
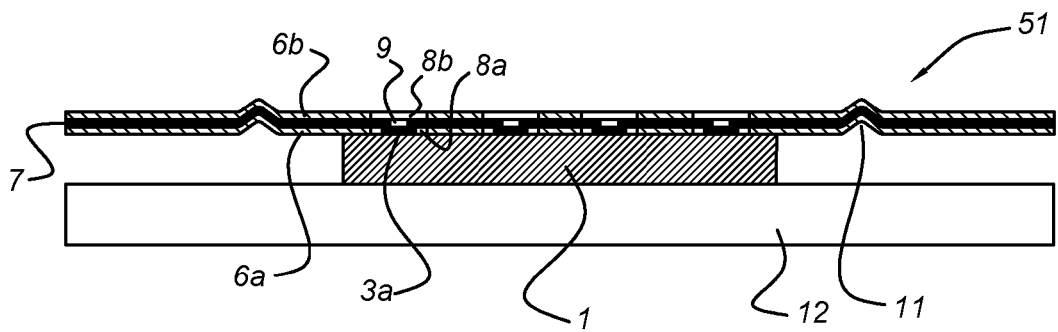
FIG. 3B shows a sectional view of the exemplary embodiment of the assembly as shown in FIG. 3A, wherein the flexible PCM comprises apertures in the insulating films and holes in the exposed conducting layer which are placed directly over and aligned with electrical contacts on the substrate.
Figure 3C:
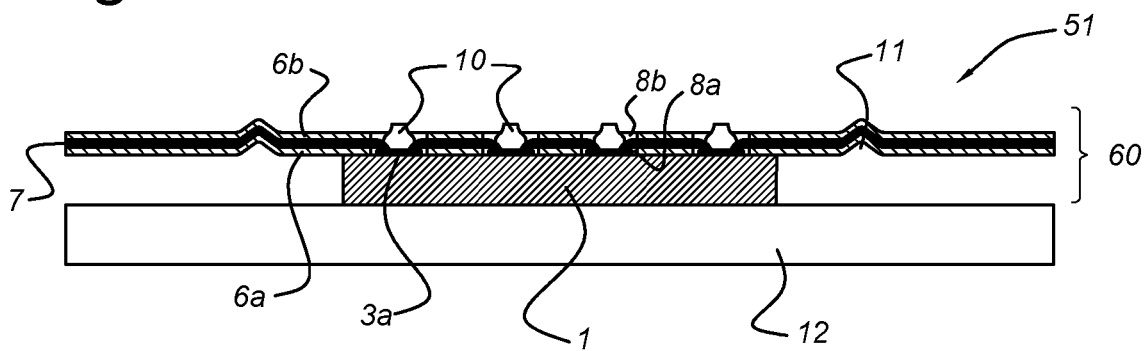
FIG. 3C shows a sectional view of the exemplary embodiment of the assembly as shown in FIGS. 3A and 3B, wherein gold ball bonds or stud bumps provide electrical connections between the conducting layer of the flexible PCM and the electrical contacts on the substrate.

FIGS. 3A, 3B and 3C show a sectional view of an exemplary embodiment of an assembly 60 according to the present invention, wherein a substrate 1 of the assembly 60 is supported by a supporting substrate or interconnect board 12. The surface of the substrate 1 distal to the interconnect board 12 carries a plurality of electrical contacts 3a. A thin flexible printed circuit membrane (PCM) 51 of an assembly 60 according to the present invention comprises a thin gold layer 7 that is arranged to provide conducting tracks as will be described in more detail below.

FIG. 3A shows that a thin flexible insulating film 6 comprises a first insulating film 6a and a second insulating film 6b. The thin gold layer 7 is sandwiched between the two insulating films 6a and 6b of the insulating film 6. Alternatively, the insulating film 6 may comprise a single insulating film 6a that is at least partially covered with the thin gold film 7. Depending in the need for insulation between contacts and contact tracks formed by the thin gold layer 7, the thin gold layer 7 may be located either on a first side of the insulating film 6a that faces the substrate 1 or on a second side of the insulating film 6a that faces away from the substrate 1.

As shown in FIG. 3A, the thin gold layer 7 sandwiched by the insulating films 6a and 6b is locally exposed at apertures 8a and 8b in the insulating films 6a and 6b respectively. The thin gold layer 7 as exposed in the apertures 8a and 8b has a hole 9 that is aligned with the apertures 8a and 8b in the insulating films 6a and 6b. As shown in FIG. 3B, the apertures 8a and 8b and the hole 9 in the exposed thin gold layer 7 are placed directly over and aligned with electrical contacts 3a on for example a PIC that is comprised by substrate 1. Thereafter, as is shown in FIG. 3C, a gold ball 10 is either thermo-sonically formed or formed by thermo-compression. The thin gold layer 7 is locally deformed and the gold ball 10 electrically connects the gold layer 7 to the electrical contact or contact pad 3a on the PIC of substrate 1 and in addition confers mechanical strength to the connection. On account of the flexibility of the thin gold film 7 and/or the thin insulating films 6a and 6b, the stresses applied to the PIC as a result of the electrical connections can be kept adequately low, i.e. at such a level that the overall performance of the PIC, which includes at least optical and thermal performance, is not impaired.

Figure 6:
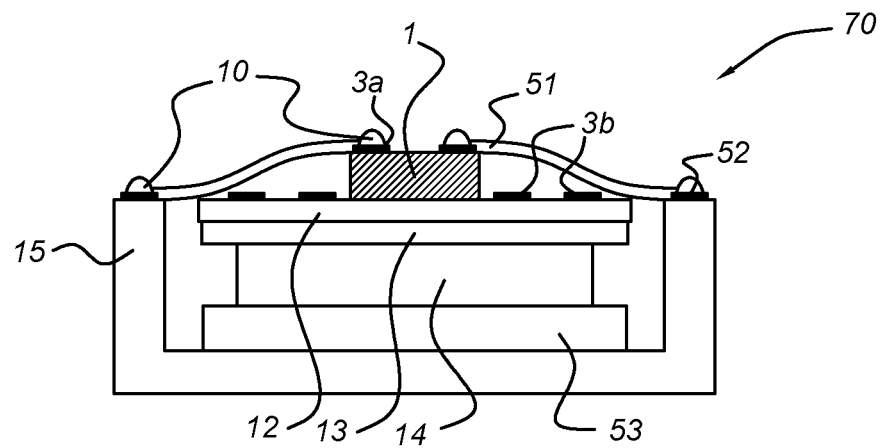
FIG. 6 shows a sectional view of an exemplary embodiment of a chip package according to the present invention using the thin flexible PCM for electrically connecting a PIC or EIC and an electrically conducting terminal of the housing directly, i.e. without providing an electrical connection via the interconnect board.

The other end of the electrical connection in the PCM may be electrically terminated with a connector (not shown) or by using a bonding technique, which may advantageously be the same ball bond technique as is used for providing electrical contact to the PIC, to connect the PCM to another PIC, an EIC, an interconnect board or a package 70 such as is shown in FIG. 6.

Figure 4:
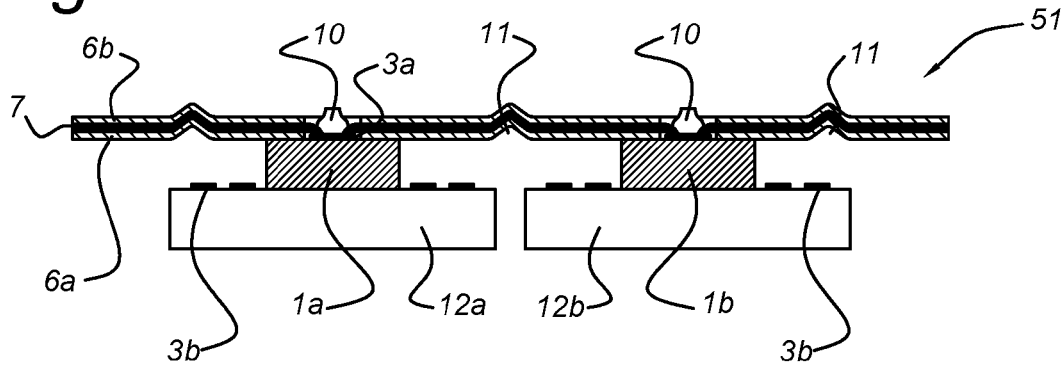
FIG. 4 shows a sectional view of two mechanically isolated structures joined electrically via a flexible PCM of an assembly according to the present invention, wherein the flexible PCM additionally comprises mechanical decoupling means that are arranged to allow for mechanical stress and strain relief between the two structures.

For device structures where external stress or strain may otherwise be placed on the electrical connection (3a, 9, 10) formed according to the present invention, it is possible to add to, or form in, the flexible PCM 51 a mechanical decoupling means 11 for mechanically decoupling the area of the contacts (3a, 8a, 8b, 9, 10) from externally applied stresses and/or strains. The mechanical decoupling means 11 may be formed as a simple bend or fold in the flexible PCM 51, or by any mechanical equivalents which are capable of absorbing external stresses and/or strains. Mechanical decoupling may be used to advantage if two or more independent devices, whether two or more PICs or at least one PIC and another device or devices such as EICs, are connected by a flexible PCM 51, such as is shown for example in FIG. 4 with respect to a substrate 1a and a further substrate 1b of the assembly 60 according to the present invention. Mechanical decoupling may be required, for example, within optical transceivers, where the transmitter and receiver may require some electrical connections between them and may move relative to each other for example on account of heat related expansion and/or contraction.

Figure 5:
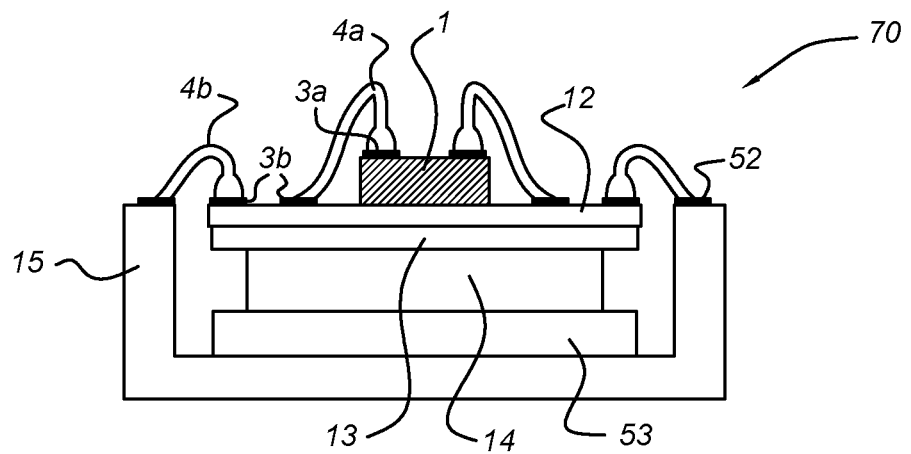
FIG. 5 shows a sectional view of a prior art chip package using wire bonds for electrically connecting a substrate, which for example comprises a PIC or an EIC, with an electrically conducting terminal of a housing of the chip package via an interconnect board that is thermally connected with the housing of the chip package via an epoxy resin, a heat sink and a thermoelectric cooler (TEC)

FIG. 5 shows a sectional view of a prior art chip package 70 comprising a substrate 1 located in a housing 15. The substrate 1, which for example comprises a PIC, is placed on an interconnect board or supporting substrate 12, which is mounted on a heat sink 14 using, for example, epoxy resin 13. The heat sink 14 may then be mounted on a thermo-cooler (TEC) 53 or other arrangement for providing efficient conduction of heat away from the PIC comprised by substrate 1. The PIC 1 is connected by wire bonds 4a to conductor tracks or bond pads 3b on the interconnect board 12 on which the substrate 1 is located. The conductor tracks 3b on the interconnect board 12 are, in turn, wire-bonded by wires 4b to electrically conducting terminals 52 on the housing 15 of the chip package 70.

FIG. 6 shows a sectional view of an exemplary embodiment of a chip package 70 according to the present invention. The structure of the chip package is overall similar to the prior art chip package shown in FIG. 5. However, instead of being connected by bond wires 4b to an interconnect board 12 which then provides the onward connections to the terminals 52 on the housing 15, the substrate 1 in FIG. 6 is connected by using a flexible PCM 51 of the assembly 60 according to the present invention in order to form electrical connections between the substrate 1 and the electrically conducting terminals 52 on the housing of the chip package 70. Electric contacts 3a on the substrate 1 are connected directly to corresponding terminals 52 on the housing 15 of the chip package 70 by the flexible PCM 51, thus obviating the need for an interconnect board 12 and resulting in a simpler structure. In the prior art configuration shown in FIG. 5, the interconnect board 12 would be required for high speed products where controlled impedance between the device comprised by the substrate 1 and the chip package 70 is required. In the case of the exemplary embodiment of the chip package 70 according to the present invention as is shown in FIG. 6, the flexible PCM 51 provides controlled impedance from the device comprised in the substrate 1 to the chip package 70.

Also, owing to the lengths of the wire bonds 4a and 4b in the prior art structure shown in FIG. 5, which lengths are required owing to the process of making the wire bonds, there will be degradation in performance for very high-speed devices on account of the inductance associated with the lengths of the wires 4a and 4b. In the case of the flexible PCM 51 such electrical connections are direct and with minimal length and hence will provide improved and consistent high-speed performance.

Figure 7:
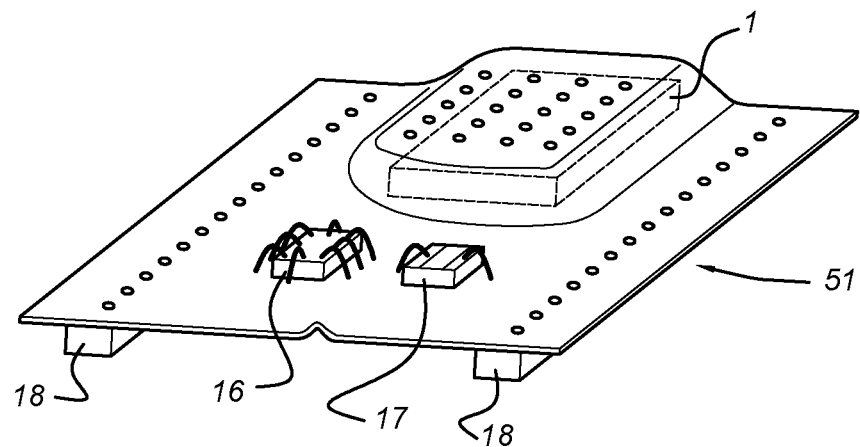
FIG. 7 shows a bird's eye view of an exemplary embodiment of a flexible PCM of an assembly according to the present invention that is connected to a PIC, which is indicated as being situated underneath the PCM, and also showing how additional functional elements such as a wire bonded IC and a transistor and a passive surface mount type component such as a resistor and a capacitor may also be added to the same PCM, as well as a connection of the PCM to a device package or an interconnect board.

FIG. 7 shows a bird's eye view of an exemplary embodiment of the flexible PCM 51 of an assembly 60 according to the present invention that is connected to a PIC, which is indicated as being situated underneath the PCM. FIG. 7 furthermore illustratively shows that the flexible PCM 51 can also provide a platform for adding such devices as, but not limited to, EICs, transistors and passive components. Such devices can be attached using conventional technology, but not limited to, soldering, adhesives and welding. Interconnect to the flexible PCM 51 is possible, but not limited to, direct electrical connection or through the use of wire bonds or flip chip techniques.

The entire structure as shown in FIG. 7 can be environmentally protected by using in-fill materials or glob top materials. Such materials are usually, but not limited to, silicone based and would require complete encapsulation of the structure to become effective. By adding open ports or holes into the inactive areas of the flexible PCM 51 it would be possible to inject either directly, or using vacuum-assisted techniques to inject suitable encapsulating material around the entire flexible PCM 51 and further components that are attached to the flexible PCM 51 and that are interconnected by it. By using a flexible PCM 51 it becomes possible to interconnect PICs and ICs and other active and passive devices within a single interconnect medium and also connect this flexible PCM 51 to an external prior art printed circuit board (PCB) or electrical connector directly using the invention described using bumps. It is also possible to provide external electrical connections to either PCB or connectors using, but not limited to, soldering, epoxies or welding techniques from the flexible PCM 51 to external media.

Referring again to FIG. 3C and FIG. 4, the electrical contact from the device comprised by the substrate 1 to the external connection is achieved using the conducting layer 7 of the flexible PCM 51 being routed from point to point. In the case of complex and multiple connections, a flexible PCM 51 comprising multiple conducting layers 7a, 7b and 7c and insulating films 6a, 6b and 6c with or without electrical bridges between the different conducting layers 7a, 7b and 7c may be required. In the case of high-speed electrical interconnects it may also be necessary to introduce conductive ground planes between the insulating films 6a, 6b and 6c.

Figure 8:
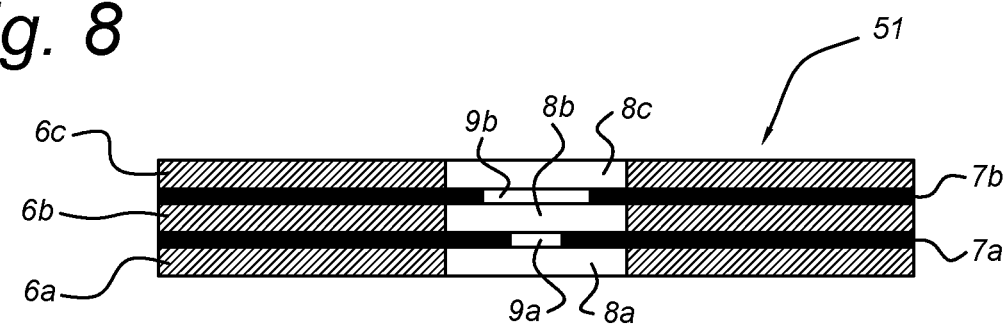
FIG. 8 shows a sectional view of an exemplary embodiment of the flexible PCM of the assembly according to the present invention comprising a stack of three insulating films and two conducing layers that are alternately arranged.

FIG. 8 shows a sectional view of an exemplary embodiment of the flexible PCM 51 of the assembly 60 according to the present invention comprising a stack of three insulating films 6a, 6b and 6c and two thin gold layers 7a and 7b that are alternately arranged. The insulating films 6a, 6a and 6c comprise apertures 8a, 8b and 8c through which the holes 9a and 9b of the thin gold layers 7a and 7b are exposed. When for example, the flexible PCM 51 shown in FIG. 8 and an electrical contact 3a on a substrate 1 are aligned, they can be electrically connected by introducing a gold ball 10 as described above. The gold ball 10 will connect the electrical contact 3a and the exposed parts of the thin gold layers 7a and 7b. As a result the two thin gold layers 7a and 7b are also electrically connected.

Referring especially to FIG. 8, it is possible to use two or more thin insulating films and thin conductor structures such as shown in FIG. 3A and align and bring them together using a bonding process to form a multilayer structure as shown in FIG. 8. The material used for the bonding can be, but not limited to, and epoxy, either in liquid or film form.

Figure 9:
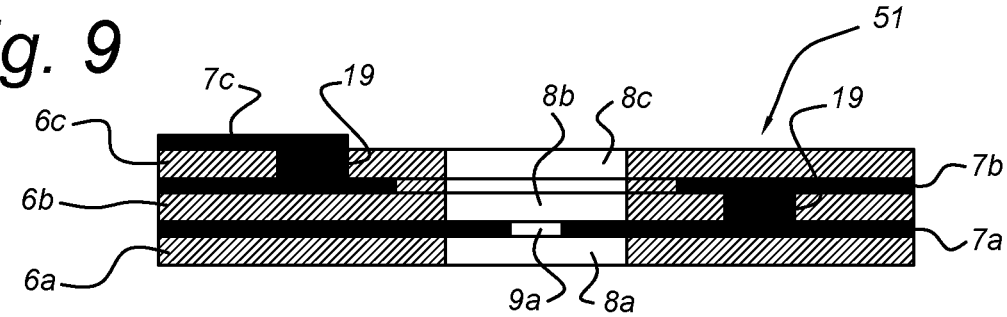
FIG. 9 shows a sectional view of an exemplary embodiment of the flexible PCM of the assembly according to the present invention showing electrical bridges between conducting layers that are separated by an insulating film.

FIG. 9 shows a sectional view of an exemplary embodiment of the flexible PCM 51 of the assembly 60 according to the present invention wherein electrical bridges between conducting layers 7a, 7b and 7c are provided by the use of vias 19. In the following, only the provision of the vias 19 in the insulating films 6b and 6c and the formation of the electrical bridges that interconnect conducting layers 7a and 7b and 7b and 7c respectively are described. A first via 19 is provided in insulating film 6b. Subsequently, a conducting material is provided to form conducting layer 7b and to fill the first via 19. By filling the first via 19, an electrical bridge is formed that interconnects the conducting layers 7a and 7b. As a next step, conducting layer 7b is at least partially covered with a further insulating film 6c. Depending on the application technique a second via 19 either has to be provided after application of the further insulating film 6c for example by using an etching technique or the second via 19 is provided as a result of partially covering conducting layer 7b with further insulating layer 6c. As a next step, a second conducting material is provided to form further conducting material 7c and to fill the second via 19. By filling the second via 19, an electrical bridge is formed that interconnects the conducting layers 7b and 7c. The second conducting material can be the same as the conducting material used to form the electrical bridge between conducting layers 7a and 7b. However, it is also possible to use a different conducting material. In the latter case, it is apparent to the person skilled in the art that the two conducting materials should be compatible. The vias 19 can be produced using conventional photolithographic and etching techniques or laser cutting.

It will be apparent to the person skilled in the art that the procedure described above with respect to FIG. 9 can be repeated if a flexible PCM 51 is required comprising additional conducting layers and insulating films. It will also be apparent to the person skilled in the art that expanding the number of conducting layers and insulating films is limited by the resulting flexibility of the PCM 51 that is still acceptable for a specific application.

It will be clear to a person skilled in the art that the scope of the present invention is not limited to the examples discussed in the foregoing, but that several amendments and modifications thereof are possible without deviating from the scope of the present invention as defined in the attached claims. While the present invention has been illustrated and described in detail in the figures and the description, such illustration and description are to be considered illustrative or exemplary only, and not restrictive. The present invention is not limited to the disclosed embodiments but comprises any combination of the disclosed embodiments that can come to an advantage.

Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the present invention.

The present invention can be summarized as follows. An assembly 60 comprising a substrate 1 that is provided with at least one electrical contact 3a, a flexible printed circuit membrane 51 comprising an electrically insulating film 6 and an electrically conducting layer 7 that is at least partially covering the insulating film 6. The conducting layer 7 is at least locally accessible from outside of the membrane 51. A connection means 10 is further provided for electrically connecting the at least one electrical contact 3a and the conducting layer 7 at a position where the conducting layer 7 is accessible, to form an electrical connection between the substrate 1 and the membrane 51.

A chip package 70 comprising a housing 15 having at least one electrically conducting terminal 52, and an assembly 60 as mentioned. The flexible printed circuit membrane 51 is arranged for electrically connecting the substrate 1 of the assembly 60 and the at least one terminal 52 of the housing 15.

With the increasing complexity of integrated circuits in general and phonic integrated circuits (PICs) in particular, the physical size and number of electrical connections 3a also increases. In PICs the electrical connections 3a can rarely be routed to the edges of a die for wire bonding to a housing 15 of a chip package 70. Conventional methods of electrically connecting a PIC, either using wire bonding or flip chip bonding both have problems. In the case of wire bonding, the density and length of the wires 4a, 4b can seriously affect the performance and manufacturability of a device. In the case of flip chip bonding, stresses created by the bonding process and interconnect material can reduce both functional and thermal performance of the device. The assembly 60 and the chip package 70 according to the present invention overcome the problems associated with the conventional methods mentioned above.

The invention claimed is:

1. An assembly comprising:
   a substrate that is provided with at least one electrical contact, the substrate comprising a semiconductor substrate that comprises an opto-electronic device;
   a flexible printed circuit membrane comprising an electrically insulating film and an electrically conducting layer that is at least partially covering the insulating film, wherein the conducting layer is at least locally accessible from outside of the membrane, the conducting layer being a metal layer comprising a thin film of gold and/or copper, and
   a ball-shaped gold stud that is arranged using thermosonic bonding for electrically connecting the at least one electrical contact and the conducting layer at a position where the conducting layer is accessible, to form an electrical connection between the substrate and the membrane.

2. The assembly as claimed in claim 1, wherein the insulating film is provided with at least one aperture for locally exposing the conducting layer, wherein the aperture is aligned with the electrical contact, and wherein the ball-shaped gold stud is arranged at a position of the at least one aperture of the insulating film.

3. The assembly as claimed in claim 2, wherein the conducting layer as exposed in the at least one aperture of the insulating film has a hole aligned with the aperture, and wherein the ball-shaped gold stud is arranged to locally deform the conducting layer at the position of the hole.

4. The assembly as claimed in claim 1, wherein the opto-electronic device is a photonic integrated circuit.

5. The assembly as claimed in claim 1, wherein the semiconductor substrate comprises Indium Phosphide.

6. The assembly as claimed in claim 1, wherein the flexible printed circuit membrane comprises a mechanical decoupling means that is arranged for mechanically decoupling the electrical connection from externally applied stress and/or strain.

7. The assembly as claimed in claim 6, wherein the mechanical decoupling means comprises at least one of a bend and a fold in the flexible printed circuit membrane.

8. The assembly as claimed in claim 1, further comprising at least one further substrate that is provided with at least one electrical contact, wherein the flexible printed circuit membrane is arranged for electrically connecting the substrate and the at least one further substrate.

9. The assembly as claimed in claim 8, wherein at least one of the substrate and the at least one further substrate comprises an opto-electronic device and/or a passive integrated circuit.

10. The assembly as claimed in claim 9, wherein the opto-electronic device is one of a photonic integrated circuit and an electronic integrated circuit.

11. The assembly as claimed in claim 1, wherein the assembly further comprises a printed circuit board that is electrically connected to the flexible printed circuit membrane.

12. The assembly as claimed in claim 11, wherein the flexible printed circuit membrane is provided with at least one open port or hole for receiving an encapsulating material that is arranged to seal the assembly from the outside environment.

13. A chip package comprising:
- a housing having at least one electrically conducting terminal, and
- an assembly as claimed in claim 1, wherein the flexible printed circuit membrane is arranged for electrically connecting the substrate of the assembly and the at least one terminal of the housing.

14. The chip package as claimed in claim 13, wherein the assembly further comprises at least one further substrate that is provided with at least one electrical contact, and wherein the flexible printed circuit membrane is arranged for electrically connecting the at least one terminal of the housing and at least one of the substrate and the further substrate of the assembly.

15. The chip package as claimed in claim 13, wherein the flexible printed circuit membrane is provided with at least one open port or hole for receiving an encapsulating material that is arranged to seal the chip package from the outside environment.

\* \* \* \* \*